United States Patent
Okabe et al.

(10) Patent No.: US 6,889,431 B2
(45) Date of Patent: May 10, 2005

(54) MANUFACTURING METHOD OF ELECTRONIC CIRCUIT INCLUDING MULTILAYER CIRCUIT BOARD

(75) Inventors: Hiroshi Okabe, Kokubunji (JP); Hirozi Yamada, Tsukui (JP); Eriko Takeda, Tokyo (JP); Kazunori Yamamoto, Tsukuba (JP); Hiroyuki Kuriya, Shimodate (JP); Masanori Yamaguchi, Tsukuba (JP); Kazuhisa Otsuka, Shimodate (JP); Yoshitaka Hirata, Shimodate (JP); Yasushi Shimada, Tsukuba (JP)

(73) Assignees: Hitachi, Ltd., Tokyo (JP); Hitachi Chemical Co., Ltd., Tokyo (JP)

( * ) Notice: Subject to any disclaimer, the term of this patent is extended or adjusted under 35 U.S.C. 154(b) by 307 days.

(21) Appl. No.: 10/078,448

(22) Filed: Feb. 21, 2002

(65) Prior Publication Data

US 2003/0097750 A1 May 29, 2003

(30) Foreign Application Priority Data

Nov. 26, 2001 (JP) ........................................ 2001-358836

(51) Int. Cl.$^7$ ................................................ H05K 3/02
(52) U.S. Cl. ........................ 29/847; 29/25.42; 29/846; 204/192.1; 361/763
(58) Field of Search ............................ 29/25.41, 25.42, 29/831, 847, 846, 850; 156/308.8, 387; 174/250, 259, 261; 204/192.1; 216/3, 37, 41, 13–31; 427/96–99; 361/761–763

(56) References Cited

U.S. PATENT DOCUMENTS

| | | | | |
|---|---|---|---|---|
| 4,624,737 A | * | 11/1986 | Shimbo | 438/158 |
| 5,822,175 A | * | 10/1998 | Azuma | 361/321.5 |
| 6,005,197 A | * | 12/1999 | Kola et al. | 174/260 |
| 6,757,178 B2 | | 6/2004 | Okabe et al. | 361/793 |

FOREIGN PATENT DOCUMENTS

JP  7-16099  2/1995

* cited by examiner

Primary Examiner—A. Dexter Tugbang
Assistant Examiner—Donghai D. Nguyen
(74) Attorney, Agent, or Firm—Miles & Stockbridge PC (57) ABSTRACT

The present invention provides a manufacturing method of an electronic circuit device including a multi-layer circuit board incorporated with a thin film capacitor small in size and of high performance capable of attaining higher capacitance value with a thin dielectric film of high dielectric constant and with favorable film quality. A first electrode layer and a thin film dielectric layer are laminated continuously in this order in one identical to laminate each of the layers on a leveled substrate in one identical chamber and then the first electrode layer is fabricated a conductor pattern.

8 Claims, 4 Drawing Sheets

MANUFACTURING METHOD OF ELECTRONIC CIRCUIT INCLUDING MULTILAYER CIRCUIT BOARD

BACKGROUND OF THE INVENTION

1. Field of the Invention

The present invention relates to a manufacturing method of an electronic circuit device including a multi-layer circuit board incorporated with a thin film capacitor.

2. Related Art

Figure 4:
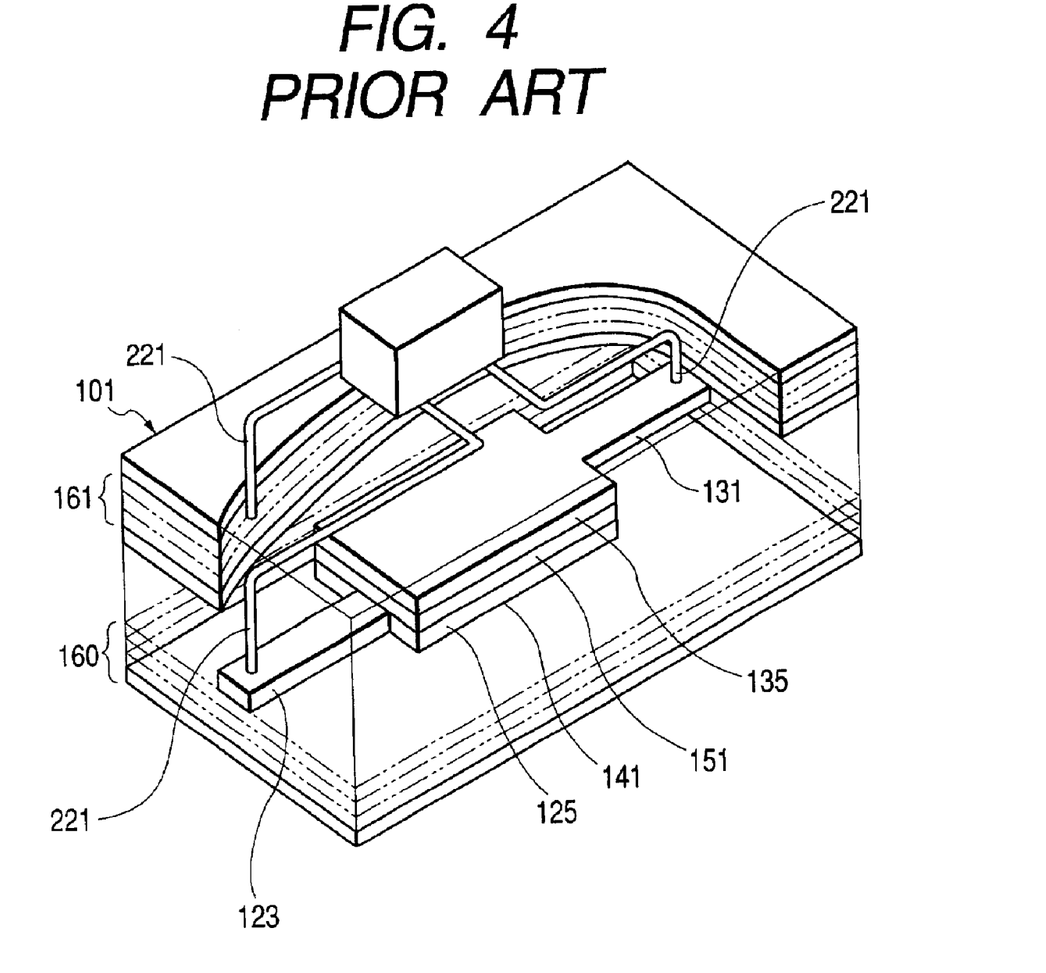
FIG. 4 is a perspective view for explaining a multi-layer circuit package as a prior art.

Along with a reduction in size of portable equipments, a technique of incorporating passive components such as capacitors into substrates with an aim of an improvement in the mounting density has been popularized mainly in cellular telephones. At present, the use of ceramic substrates is the predominant technique; however, resin substrates with built-in passive elements have been noted as mounting substrates for electronic circuit devices since they are light in weight, not-chipped and inexpensive. In a case of incorporating capacitors in substrates, the use of thin film capacitors capable of increasing the capacitive density is advantageous for a reduction in size. Substrates with built-in capacitors and manufacturing methods thereof are described, for example, in Japanese Patent Publication No. Hei 7-16099 as the prior art. The constitution of the circuit package is to be described schematically for the portions relevant to this invention with reference to FIG. 4. A circuit package 101 comprises substrates 160, 161 with a thin film capacitor 141 being put between them. Further, the thin film capacitor 141 is formed integrally with the substrate 160. That is, as the feature of such a constitution, the thin film capacitor 141 is disposed in a manner as to be integrated with and buried in the circuit package 101. More specifically, a thin Cu film formed on the surface of a Teflon substrate or the like is fabricated by photolithography to constitute a desired circuit for a printed circuit board. In this case, at least a first wire 123 and a first electrode 125 connected therewith for the thin film capacitor 141 are formed. An epitaxial thin film 151 comprising dielectric material is formed by sputtering at least covering the first electrode. A Cu layer is formed on the thin film dielectric 151 and, successively, Cu plating is applied thereto. The thus formed thin Cu film is fabricated into a predetermined circuit. Thus, a second electrode 135 and a second wire 131 for the thin film capacitor 141 are formed. The first and second wires are connected by way of further wires to other planes.

Known multi-layer circuit packages involve the following drawbacks.

In a multi-layer circuit package in which a thin film capacitor is formed integrally, it is usually necessary to form a dielectric layer on a conductor. Generally, there is a problem that it is difficult for ceramics as the dielectric material to grow epitaxially on the conductor. This is because the lattice constant of a metal such as Cu, Ag or Al does not match the lattice constant of ceramics to be grown thereon. As a result, sputtered thin film of ceramics is not crystallized but tends to grow-in an amorphous state. The thin amorphous film of ceramics has lower dielectric constant compared with a thin epitaxial film grown in a crystalline state. Accordingly, the capacitance value of a capacitor manufactured by using the thin film is smaller than that manufactured by using a thin epitaxial film.

Further, in a case of using an easily oxidizable metal such as Cu or Al as the conductor, when oxide ceramics are sputtered thereon, the surface of a metal forming a first signal core is oxidized to form an oxide layer other than the thin ceramic film for instance. As a result, the thickness of the dielectric layer is increased to result in a problem of lowering the capacitance value.

Further, in the existent multi-layer circuit packages and the manufacturing methods thereof, a first signal core is formed as a circuit by patterning a conductor by means of photolithography and a thin film of dielectric material is formed on the first signal core. However, since it is difficult to completely remove a resist disposed for patterning without giving damage to the surface of the conductor, a residue is left. When a thin film of the dielectric material is formed on the surface of the conductor contaminated with organic residues such as a resist, this results in a problem of deteriorating the film quality which may cause lowering of the dielectric constant or generation of leak current.

SUMMARY OF THE INVENTION

An object of this invention is to provide a multi-layer circuit board incorporated with a thin film capacitor capable of attaining a high capacitance value by using a thin dielectric film of high dielectric constant and good film quality, an electronic circuit device using the same, as well as a manufacturing method thereof.

This invention provides an electronic circuit device using a multi-layer circuit board having a thin film capacitor constituted by putting a thin film dielectric layer between a first electrode and a second electrode, in which a first electrode layer and a thin film dielectric layer are laminated continuously in this order on a base substrate within one identical chamber and then fabricating the first electrode layer to form a conductor pattern of the first electrode. The base substrate herein means a multi-layer circuit substrate.

Laminating within one identical chamber means herein that each of the layers is formed without once opening an atmosphere used for the formation of such electrode layer or wiring layer. The thin film described above is formed by using vapor deposition, chemical vapor phase deposition (CVD), plasma CVD, electron beam epitaxy, sputtering or reactive sputtering. Various conditions regarding the growth for each layer may be in accordance with customary conditions. The feature of this invention is to laminate the first conductor layer and the dielectric layer in this order on the base substrate continuously in one identical chamber and then fabricating the first conductor layer.

For the base substrate, organic polymeric resins, for example, polyimide, teflon and glass epoxy are practically useful. It will be apparent that the base substrate is desirably leveled.

Ordinary materials may be used for the dielectric material. They include, for example, calcium titanate, barium titanate, aluminum oxide, beryllium oxide and aluminum nitride. Further, oxide thin films having a perovskite structure typically represented by strontium titanate and barium strontium titanate are particularly preferred.

By the adoption of such means as described above, it is possible to laminate a metal as a first electrode layer in a planar shape on which a thin film dielectric material can be epitaxially grown on a planar base substrate arid, further, epitaxially grow a thin film dielectric layer of favorable film quality further thereon and, subsequently, form a thin film capacitor. Therefore, it is possible to realize a thin film capacitor of a small size and high performance having a thin film dielectric material of high dielectric constant and favorable film quality in a multi-layer circuit board with no defects causing current leakage which would result in a problem in a case of laminating a thin film dielectric layer on a stepped electrode In a manufacturing method of an electronic circuit device using a multi-layer circuit board according to this invention, when a first conduction layer is disposed between the first electrode layer and the base substrate, adhesion between the first electrode layer and the base substrate can be improved to enhance the reliability.

In the manufacturing method of an electronic circuit device using a multi-layer circuit board according to this invention, when a second connection layer is disposed on the surface of the second electrode layer on the side connected with the thin film dielectric layer, adhesion between the second electrode layer and the thin film dielectric layer can be improved to enhance the reliability.

In the manufacturing method of the electronic circuit device using the multi-layered circuit board according to this invention, when the surface of the base substrate is leveled with a resin and the first electrode is disposed thereon, planarity for the first electrode and the thin film dielectric layer to be laminated can be improved. Accordingly, since the thickness of the thin film dielectric layer that can be laminated without causing defects can be reduced, a thin film capacitor of higher capacitance value can be obtained. As the leveling resin, polyimide or BCB (benzocyclobutene) is practically useful for instance.

Further, the subject of this invention as described above can be solved effectively in an electronic circuit device using a multi-layer circuit board having a thin film capacitor constituted by putting a thin film dielectric layer between a first electrode and a second electrode, by laminating the first electrode layer and the thin film dielectric layer in this order on the base substrate continuously within one identical chamber, then fabricating each of the layers in the order of the thin dielectric layer and the first electrode layer, forming through holes in the base substrate including each of the layers, applying plating to the surface of the base substrate including each of the layers on the side having the first electrode layer and at the inside of the through holes thereby forming a conductor layer constituting the first wiring layer and the second electrode layer to the surface of the base substrate on the side having the first electrode layer and through hole conductors at the inside of in the through holes, and fabricating the conductor layer constituting a first wiring layer and a second electrode layer, thereby forming a conductor pattern of the first wirings connected to the first electrode and a conductor pattern of a second electrode According to the method as described above, the conductor layer constituting the first wiring layer and the second electrode layer can be formed collectively with the formation of the through hole conductor. Accordingly, the method can simplify the manufacturing steps of the multi-layer circuit board having the thin film capacitor and can reduce the manufacturing.

Then, after fabricating each of the layers in the order of the thin film electric layer and the first electrode layer, when a second connection layer is laminated on the first electrode layer and the thin film dielectric layer and then through holes are formed in the base substrate including each of the layers, the close adhesion strength between the thin film dielectric layer and the conductor layer by plating can be improved by the second connection layer upon fabrication of the conductor layer that constitutes the first wiring layer and the second electrode layer by plating, and contamination for the surface of the thin film dielectric layer upon forming the through holes can be prevented. Accordingly, this method can improve the production yield and prevent the degradation of the quality of the thin film capacitor.

Further, before laminating the first electrode layer, when a metal film is disposed on the base substrate on the surface not provided with the first electrode layer or on both surfaces thereof, a thin film capacitor of high performance having a thin film dielectric material of high dielectric constant and with favorable film quality can be obtained in the multi-layer circuit board in the same manner as the method described above. Further, since a substrate formed by bonding a metal film to the dielectric layer as used in the formation of a usual multi-layer circuit board is used for the substrate to which the thin film capacitor is formed, existent facilities and the steps can be used for the handling and multi-layering steps of the substrate. Therefore, this method can suppress the investment for development of new facilities and steps.

The foregoing subject of this invention can be solved effectively in an electronic circuit device including a multi-layer circuit board having a thin film capacitor constituted by putting a thin film dielectric layer between a first electrode and a second electrode, by using a metal plate constituting a first wiring layer for the base substrate, laminating a first electrode layer, a thin film dielectric layer, and a second electrode layer in this order on the metal plate continuously within one identical chamber, then fabricating the second electrode layer, thereby forming a conductor pattern including the second electrode, disposing on the second electrode layer an intermediate wiring layer electrically connected through via-holes with the second electrode layer, the first electrode layer or the first wiring layer by way of the dielectric layer and, further, fabricating the first wiring layer and the first electrode layer, thereby forming a conductor pattern including the first electrode.

According to the method described above, a thin film capacitor of high performance having a thin film dielectric of high dielectric constant and with favorable film quality can be attained in a multi-layer circuit board. Further, since the base substrate itself is used for the first wiring layer, the step of forming the first wiring layer is not necessary. Accordingly, this method can simplify the manufacturing step and reduce the manufacturing cost.

In this case, when the second electrode layer is fabricated to form a conductor pattern including the second electrode, when a carrier film is appended on the surface of the metal plate opposite to the surface provided with the first electrode layer, this can improve the handlability of the metal plate upon fabricating the second connection layer and the second electrode layer to improve the operation efficiency.

In the methods described above, as the metal used for the first electrode layer on which a thin film dielectric material can be grown epitaxially, a metal selected from the group consisting of Ru, Pt and Pd is preferably used.

For example, as the thin film dielectric layer epitaxially grown on the metal selected from the group consisting of Ru, Pt and Pd and showing high dielectric constant, an oxide thin film having a perovskite type oxide typically represented by strontium titanate or barium strontium titanate is preferred.

For the first connection layer or the second connection layer, a metal selected from the group consisting of Cr, Mo and Ti is suitable.

BRIEF DESCRIPTION OF THE DRAWINGS

The above and other objects, features and advantages of the present invention will become more apparent from the following description taken in connection with the accompanying drawings, in which.

DESCRIPTION OF PREFERRED EMBODIMENTS

Preferred embodiments of a method of manufacturing an electronic circuit device using a multi-layer circuit board according to this invention are to be described in detail with reference to the accompanying drawings. Identical references in FIGS. 1 to 4 indicate identical or similar components.

<Embodiment 1>

FIGS. 1A to 1G are cross sectional views showing a first embodiment for a method of manufacturing an electronic circuit using a multi-layer substrate according to this invention in the order of steps. Since ordinary manufacturing apparatus may be used and, accordingly, detailed explanations therefore are to be omitted.

Figure 1A:
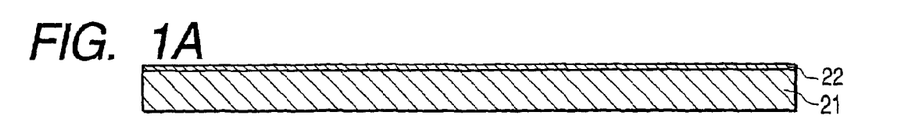
FIG. 1A is a cross sectional view for explaining a first embodiment of an electronic circuit device using a multi-layer circuit board according to this invention.
Figure 1B:
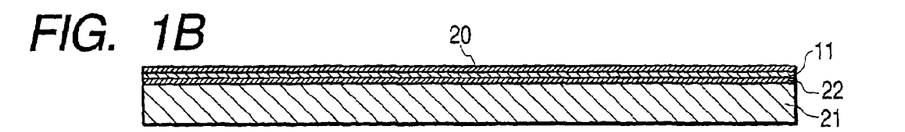
FIG. 1B is a cross sectional view for explaining a first embodiment of an electronic circuit device using a multi-layer circuit board according to this invention.

At first, as shown in FIG. 1A, a leveling resin layer 22 comprising benzocyclobutene of 10 $\mu$m thickness is coated by a curtain coat method on a base substrate 21 comprising a polyimide film of 200 $\mu$m thickness to level the upper surface of the base substrate. Then, a first electrode layer 11 comprising ruthenium (Ru) of 0.2 $\mu$m thickness is laminated by sputtering on the organic polymeric resin layer 22 using a sputtering apparatus (FIG. 1B). Successively, a thin film dielectric layer 20 comprising strontium titanate of 0.3 $\mu$m thickness is laminated by sputtering while changing a target in one identical chamber. Strontium titanate is epitaxially grown on the Ru layer by sputtering in an argon atmosphere at an oxygen partial pressure of 10% at a substrate temperature of 250° C. In this invention, it is important that the Ru layer 11 and the thin film dielectric layer 20 thereon are formed in one identical chamber without once opening the chamber. This can form a metal layer on which the dielectric layer can be grown epitaxially and can epitaxially grow the dielectric layer on the metal layer favorably in the state as it is.

Figure 1C:
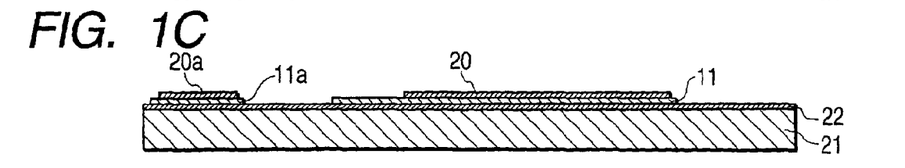
FIG. 1C is a cross sectional view for explaining a first embodiment of an electronic circuit device using a multi-layer circuit board according to this invention.

Then, the thin film dielectric layer 20 is etched into a desired shape and, further, the first electrode layer 11 is etched into a desired shape to form a conductor pattern 11a of the first electrode (FIG. 1C). Since FIGS. 1A to 1G are cross sectional views, a planer pattern for the thin film dielectric layer 20 and the conductor pattern 11a of the first electrode are not shown. Since the shape is identical with ordinary one, the illustration thereof is omitted. In this invention, after stacking to form the metal layer and the dielectric layer, the metal layer as the electrode is fabricated into a desired shape. As described above, since the dielectric layer is formed while preventing formation of the oxide on the metal layer, inclusion of unnecessary oxide layer can be eliminated effectively. Thus, the capacitance of the capacitor can be ensured to a desired value.

Figure 1D:
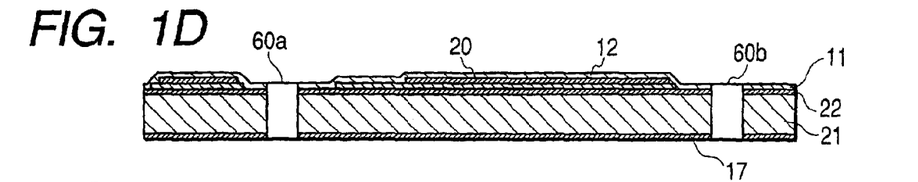
FIG. 1D is a cross sectional view for explaining a first embodiment of an electronic circuit device using a multi-layer circuit board according to this invention.
Figure 1E:
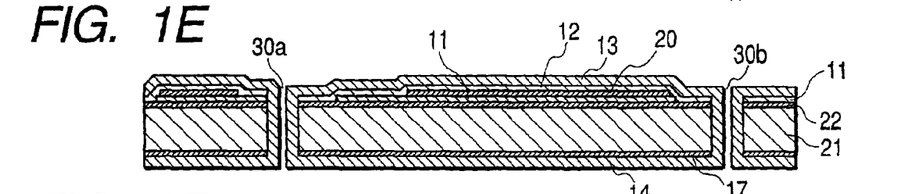
FIG. 1E is a cross sectional view for explaining a first embodiment of an electronic circuit device using a multi-layer circuit board according to this invention.
Figure 1F:
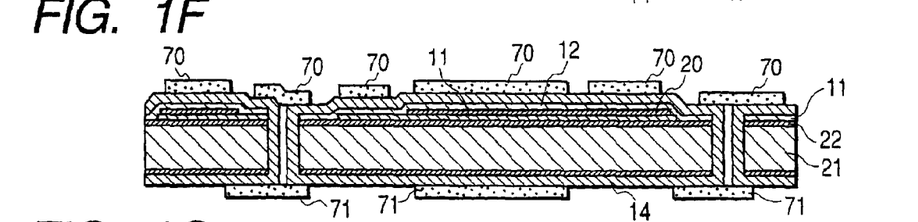
FIG. 1F is a cross sectional view for explaining a first embodiment of an electronic circuit device using a multi-layer circuit board according to this invention.
Figure 1G:
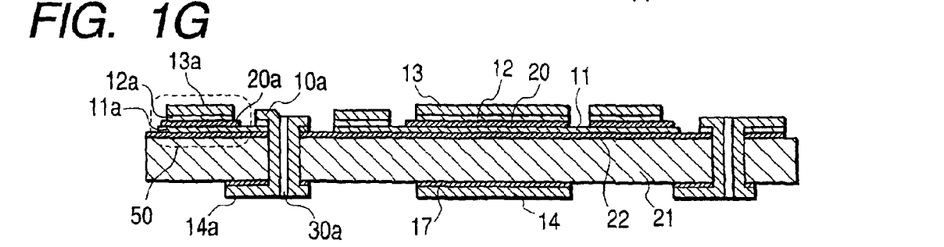
FIG. 1G is a cross sectional view for explaining a first embodiment of an electronic circuit device using a multi-layer circuit board according to this invention.

Cr forming a second connection layer 12 is laminated by sputtering to 0.05 $\mu$m thickness on the leveling resin 22 of the base substrate 21 including the thus fabricated thin film dielectric layer 20 and first electrode layer 11 by sputtering and, further, another connection layer 17 is formed by sputtering on the rear face of the base substrate. Further, through holes 60a, 60b are formed by drilling in the substrate 21 (FIG. 1D). A Cu layer of 25 $\mu$m thickness is formed by applying plating on the second connection layer 12, on another connection layer 17 and in the through holes 60a, 60b, to form conductor layers 13 for constituting first wiring conductor and a second electrode, an intermediate conductor layer 14 and through holes 30a, 30b (FIG. 1E). A resist film is appended on the conductor layer 13 and the intermediate conductor layer 14 and exposed to form resist patterns 70, 71 of a desired shape (FIG. 1F). Using the resist pattern as a mask region, a conductor pattern 10a connected with the first electrode 11a, a conductor pattern 13a of the second electrode including a second connection layer 12a and an intermediate conductor pattern 14a connected by way of the through hole 30a with the conductor pattern 10a of the first wiring are formed by etching. Subsequently, the resist pattern is removed (FIG. 1G).

By the steps described above, a thin film capacitor 50 formed by putting the thin dielectric film 20a between the first electrode 11a and the second electrode 13a can be formed on the base substrate. In FIG. 1G, a portion for the capacitor is shown being surrounded by a dotted line.

Subsequently, the circuit is formed into a multi-layered structure by a usual processes for manufacturing a multi-layer printed circuit board to manufacture an electronic circuit device by mounting desired semiconductor devices or chip components. The description of the ordinary manufacturing process is to be omitted.

In this embodiment, a thin film capacitor small in size and of higher performance having a thin dielectric film of high dielectric constant and with favorable film quality can be manufactured in the multi-layer circuit substrate. This is because the following steps are adopted for this structure. That is, Ru as the first electrode layer on which the thin dielectric film can be grown epitaxially is laminated in a planar state on the planar base substrate and the thin film dielectric layer comprising strontium titanate is epitaxially grown further thereon and, subsequently, the first electrode layer is fabricated to form the thin film capacitor. In this case, it is important that the first electrode layer and the thin film dielectric layer are formed in one identical chamber without opening the chamber.

As described above, the following drawbacks which result in a problem when the thin dielectric film is laminated on the conductor formed into the circuit in the prior art can be avoided. Then, as a result, the capacitance value per unit area of the thin film capacitor can be made greater. The drawbacks are as follows:

(1) Dielectric constant is lowered due to the conductor surface contaminated by fabrication.

(2) There is no generation of current leakage due to defects formed at the stepped portion of the circuit.

(3) Since the surface of the base substrate is leveled by the resin to improve the planarity in this embodiment, the thickness of the thin dielectric film capable of forming a capacitor with no pinholes can be reduced.

The material for the first electrode is not restricted to the illustrated Ru and metals belonging to the group VIII of the periodical table such as Pt and Pd may be used preferably. Such metals are selected preferably from those having lattice constants similar with those of the thin dielectric film laminated thereon. This can facilitate epitaxial growth of the thin dielectric film on the metal layer. Further, since the metal described above is resistant to oxidation, it can avoid the lowering of the capacitance value caused by oxide layer formed on the surface of the conductor which results in a problem in a case of laminating a thin dielectric film containing oxygen on an easily oxidizable conductor, for example, Cu as in the prior art. As the thin film dielectric layer that is epitaxially grown on the metal selected from the group consisting of Ru, Pt and Pd and exhibits a high dielectric constant, perovskite type dielectric materials are preferred. More specifically, they can include not only strontium titanate as in this example bur also includes, for example, thin oxide film having a perovskite structure such as barium strontium titanate.

In this embodiment, Cr for the second connection layer is formed on the surface of the thin film dielectric layer and the second electrode is formed thereon. Accordingly, this can improve the adhesion between the second electrode layer and the thin film dielectric layer to enhance the reliability. The Cr layer is useful for adhesion of both layers. Although not illustrated in this embodiment, it is also preferred to provide a first connection layer comprising Cr of 0.05 $\mu$m thickness like in the second connection layer of this embodiment on the base substrate or on the resin leveling the surface of the base substrate before disposition of the first electrode layer and, subsequently, laminate the first electrode. This structure can improve the adhesion between the first electrode and the base substrate or the resin leveling the surface of the base substrate to improve the reliability. The material for the first connection layer and the second connection layer is not restricted only to Cr but metals selected from the group consisting of Cr, Mo and Ti are suitable.

Further, in this embodiment, the conductor layer for constituting the first wiring layer and the second electrode layer could be formed collectively with the through hole conductor, to simplify the manufacturing steps and reduce the manufacturing cost.

That is, this embodiment adopts the following steps: (1) fabricating the laminated thin film dielectric layer and first electrode layer, (2) forming the through holes in the base substrate including each of the layers, and (3) plating the surface of the base substrate including each of the layers having the first electrode layer and the inside of the through holes to form a conductor layer constituting the first wiring layer and the second electrode layer on the surface of the base substrate having the first electrode layer and the through hole conductor in the through holes. In this way, the conductor layer constituting the first wiring layer and the second electrode layer can be formed collectively with the through hole conductor.

Further, in this example, the second connection layer is laminated on the first electrode layer and the thin film dielectric layer before forming the through holes. Therefore, adhesion strength between the thin film dielectric layer and the conductor layer formed by plating can be improved, and contamination on the surface of the thin film dielectric layer upon forming the through holes can be prevented. Thus, the production yield can be improved and degradation in the quality of the thin film capacitor can be prevented.

Further, in this embodiment, while the polyimide film is used for the base substrate, a glass epoxy substrate or a Teflon substrate which is a substrate material for usual printed circuit boards may also be used. Further, when a substrate in which a metal film is previously formed on the surface not provided with the first electrode layer is used as the base substrate, the production steps can be simplified. That is, the step of laminating other connection layer 17 and forming the intermediate conductor layer 14 conducted in this embodiment can be saved by using the substrate described above. Further, when a substrate having metal films provided on both surfaces, for example, a glass epoxy substrate Cu-appended on both surfaces is used as the base substrate, a thin capacitor film of high performance having a thin dielectric film of high dielectric constant and with favorable film quality can be obtained in a multi-layer circuit substrate like that in this embodiment. In addition to the advantages described above, since the substrate of the structure identical with the substrates used for forming ordinary multi-layer circuit substrates is used as the base substrate, existent facilitates and steps can be used for the handling of the substrate and multi-layering steps. This is useful for reducing the investment for the development of new facilities and steps.

<Embodiment 2>

FIGS. 2A–2H are cross sectional views showing the manufacturing method, in the order of steps, of an electronic circuit including multi-layer substrate according to a second embodiment of this invention. FIG. 3 is a schematic perspective view of the electronic circuit for easy understanding.

Figure 2A:
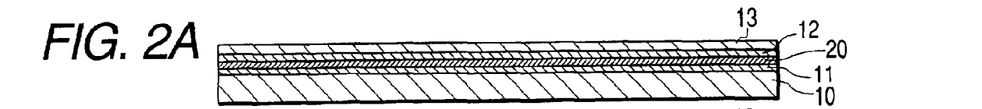
FIG. 2A is a cross sectional view for explaining a second embodiment of an electronic circuit device using a multi-layer circuit board according to this invention.
Figure 3:
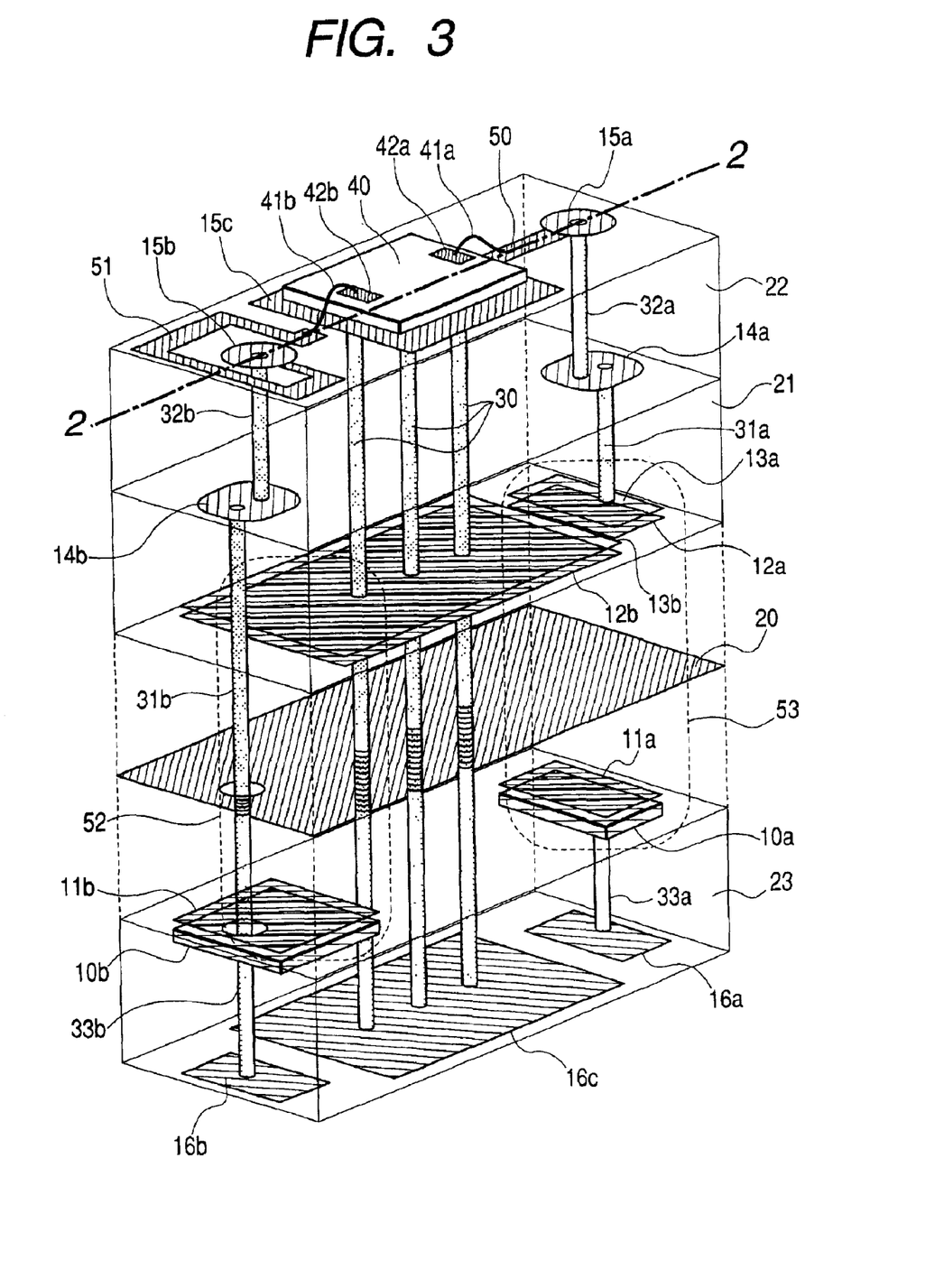
FIG. 3 is a perspective view for explaining the second embodiment of an electronic circuit device using a multi-layer circuit board according to this invention.

At first, a first electrode layer 11 comprising Ru is laminated to a thickness of 0.2 $\mu$m by sputtering on a first wiring conductor 10 comprising a treated rolled copper foil of 50 $\mu$m thickness with a leveled surface by using a sputtering apparatus (FIG. 2A). In this embodiment, the first wiring conductor 10 also serves as a base substrate. Successively, a thin film dielectric layer 20 comprising strontium titanate is laminated to 0.4 μm thickness by sputtering while changing targets within one identical chamber without opening the chamber of the sputtering apparatus. Further, after laminating a second connection layer 12 comprising Cr to 0.05 μm thickness by sputtering, Cu constituting a second electrode layer 13 is formed to 5 μm thickness by plating on the second connection layer 12. In this invention, it is important that the Ru layer 11 and the thin film dielectric layer 20 thereon are formed within one identical chamber of the sputtering apparatus without opening the chamber. This enables the formation of the metal layer on which a thin film dielectric layer can be grown epitaxially and, the dielectric layer can be epitaxially grown favorably on the metal layer in the state as it is.

Figure 2B:
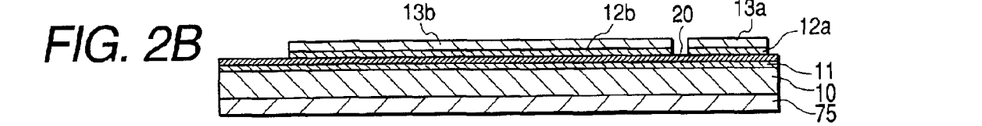
FIG. 2B is a cross sectional view for explaining the second embodiment of an electronic circuit device using a multi-layer circuit board according to this invention.

Successively, a carrier film 75 is appended to the first wiring conductor 10 on the surface opposite to the surface provided with the first electrode layer 11, and the second electrode 13 is etched to form a conductor pattern 13a of a second electrode (FIG. 2B).

Figure 2C:
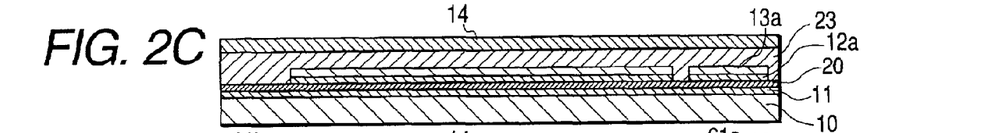
FIG. 2C is a cross sectional view for explaining the second embodiment of an electronic circuit device using a multi-layer circuit board according to this invention.
Figure 2D:
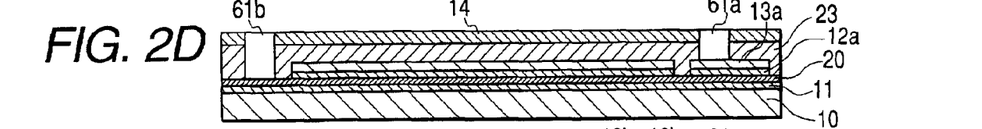
FIG. 2D is a cross sectional view for explaining the second embodiment of an electronic circuit device using a multi-layer circuit board according to this invention.
Figure 2E:
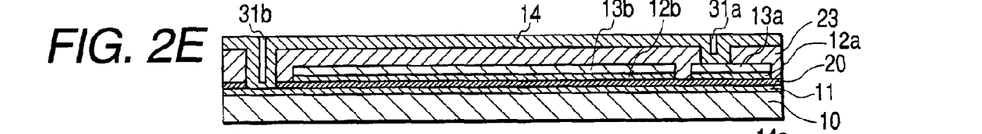
FIG. 2E is a cross sectional view for explaining the second embodiment of an electronic circuit device using a multi-layer circuit board according to this invention.
Figure 2F:
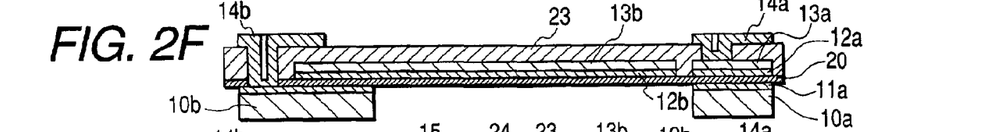
FIG. 2F is a cross sectional view for explaining the second embodiment of an electronic circuit device using a multi-layer circuit board according to this invention.

In this case, the second connection layer 12 is also etched so as to be in the same shape 12a as the conductor pattern 13a of the second electrode. A dielectric layer 23 comprising an epoxy resin of 80 μm thickness bonded with an intermediate conductor layer 14 is appended on the fabricated second electrode and the carrier film 75 is removed (FIG. 2C). The intermediate conductor layer 14 is patterned into a desired shape and holes 61a, 61b are formed in the dielectric layer 23 using the patterned layer as a mask region by $CO_2$ gas laser (FIG. 2D). Since the intensity of the $CO_2$ gas laser is set to such an intensity reflected at a metal of several μm or more, it is reflected at the second electrode 13a or the first wiring conductor 10 and the hole is not opened to a further depth. Plating is applied to inside the apertures 61a, 61b by the laser to form Cu of 25 μm thickness and form via-holes 31a, 31b (FIG. 2E). The first wiring layer 10, the first electrode layer 11 and the intermediate conductor layer 14 are patterned each into a desired shape to form a conductor pattern 10a of the first wiring, a conductor pattern 11a of the first electrode and the conductor pattern 14a of the intermediate conductor layer (FIG. 2F).

With the steps as described above, thin film capacitors 52, 53 are formed by putting the thin dielectric film 20a between the first electrode 11a and the second electrode 13a.

Figure 2G:
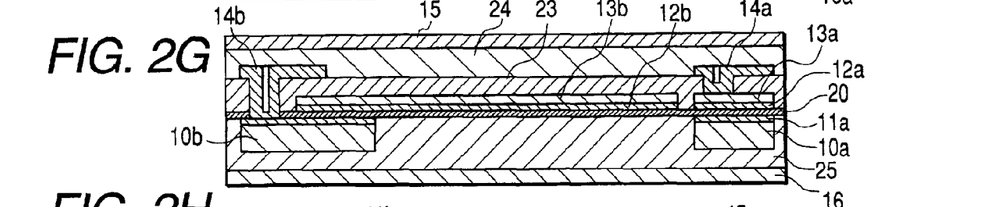
FIG. 2G is a cross sectional view for explaining the second embodiment of an electronic circuit device using a multi-layer circuit board according to this invention.
Figure 2H:
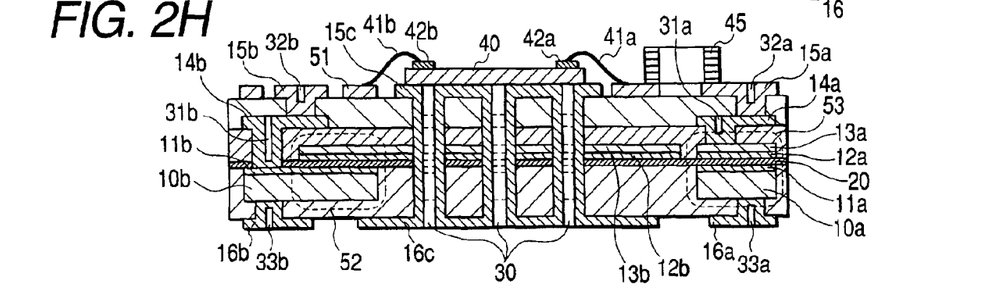
FIG. 2H is a cross sectional view for explaining the second embodiment of an electronic circuit device using a multi-layer circuit board according to this invention.

Further, in the same manner as the usual process for manufacturing multi-wire printed circuit boards, an epoxy resin which is a dielectric layer 24 appended with a copper foil constituting the surface electrode layer 15 is appended on the intermediate conductor layer and an epoxy resin as the dielectric layer 25 appended with a copper foil constituting the surface electrode layer 16 is appended on the first wirings, respectively, to form the substrate into a multi-layered structure (FIG. 2G). After aperturing laser holes or through holes in the thus multi-layered substrate, copper plating is applied to form through holes 30 and via-holes 23a, 33a. Then, the surface conductor layers 15, 16 on both surfaces are patterned to form conductor patterns 15a, 16a for the surface conductor layers and complete the multi-layered wirings. Desired semiconductor device 40 or chip component 45 are attached to the upper part thereof. In this embodiment, electrodes of the semiconductor device 40 are connected by way of bonding wires 41, while the chip electrodes of the chip component 45 are connected by soldering to surface wiring layers 15 (FIG. 2H).

With the procedures as described above, it is possible to manufacture an electronic circuit device including a multi-layered circuit board incorporated with a thin film capacitor of high performance having a thin dielectric film of highly electric constant and with favorable film quality.

In this embodiment, the thin film capacitor of high performance having a thin dielectric film of high dielectric constant and with favorable film quality can be obtained in the multi-layer circuit substrate like that in the first example and, in addition, the step of forming the first wiring layer can be saved to simplify the manufacturing steps by using the base substrate itself as the first wiring layer. In this way, the manufacturing cost can be reduced. Further, when the second electrode layer is fabricated to form the conductor pattern including the second electrode, since the carrier film is appended to the first wiring layer as the base substrate, ease of handling of the metal plate upon fabricating the second connection layer and the second electrode layer is improved, thereby enhancing the operation efficiency.

In this case, while the same epoxy resin as used for usual printed circuit boards is used for the dielectric layer upon multi-layering the substrate, other resins such as polyimide and teflon may also be used.

Further, via-holes apertured by the laser beam are used for the connection between the intermediate conductor layer and the first wiring layer and the second electrode in this embodiment, connection between the conductor layers may be established by the method such as by appending a dielectric material appended with a copper foil having a bump conductors instead of using the dielectric layer 23 bonded with the intermediate conductor layer 14. This is applicable also to other dielectric layers 24 and 25.

Further, for the first wiring, while Cu having high conductivity and optimal to the wiring material requiring transmission of signals at low loss is used for the second electrode, the intermediate conductor, the rear face conductor, the through holes and via-holes, same effect can also be obtained by using Au, Ag or Al.

According to the present invention, it is possible to manufacture an electronic circuit device including a multi-layer circuit board incorporated with a thin film capacitor small in size and of high performance capable of attaining high capacitance value by a thin dielectric film of high dielectric constant and with favorable film quality.

References used in the drawings are as follows: 10: first wiring layer, 10a: conductor pattern for first wirings, 11: first electrode layer, 11a: conductor pattern for first electrode, 12, 12a: second connection layer, 13: second electrode layer, 13a: conductor pattern for second electrode, 14: intermediate conductor layer, 14a: intermediate conductor pattern, 15, 16: surface conductor layer, 15a, 16a: surface conductor pattern, 17: connection layer, 20, 20a: thin dielectric film, 21: base substrate, 22: leveling resin, 23, 24, 25: dielectric layer, 30, 30a, 30b: through hole, 31a, 31b, 32a, 33a: via-hole, 40: semiconductor device, 41: bonding wire, 45: chip component, 50, 51: thin film capacitor, 60a, 60b: through hole, 61a, 61b: laser hole, 70, 71: resist mask, 75: carrier film,

What is claimed is:

1. A manufacturing method of an electronic circuit device including a multi-layer circuit board, comprising: forming a capacitor element in which at least a first conductor layer, a dielectric layer and a second conductor layer are formed ally with a multi-layer circuit substrate, said forming the capacitor element comprising:

a step of forming the first conductor layer and the dielectric layer on the multi-layer circuit substrate, wherein the dielectric layer is an epitaxial dielectric layer and the multi-layer circuit substrate is an organic polymeric resin circuit substrate, and the epitaxial dielectric lever is deposited on the first conductor lever without exposing the first conductor layer to atmospheric oxygen between forming the first conductor layer and depositing the epitaxial dielectric layer;

a step of fabricating the epitaxial dielectric layer into a desired shape;

a step of fabricating the first conductor layer into a desired shape; and a step of forming the second conductor layer on the epitaxial dielectric layer.

2. A manufacturing method of an electronic circuit device including a multi-layer circuit board according to claim 1, wherein the step of forming the first conductor layer and the epitaxial dielectric layer is conducted by forming the first conductor layer and the epitaxial dielectric layer on the multi-layer circuit substrate within a single chamber without opening the chamber between deposition the first conductor layer and depositing the epitaxial dielectric layer.

3. A manufacturing method of an electronic circuit device including a multi-layer circuit board according to claim 1, wherein a layer for enhancing adhesion between the multi-layer circuit substrate and the first conductor layer is formed between the multi-layer circuit substrate and the first conductor layer on the multi-layer circuit substrate and then the first conductor layer and the epitaxial dielectric layer are formed without exposing the first conductor layer to atmospheric oxygen before the epitaxial dielectric layer is deposited thereon.

4. A manufacturing method of an electronic circuit device including a multi-layer circuit board according to claim 1, wherein a layer for enhancing adhesion between the epitaxial dielectric layer and the second conductor layer is formed between the epitaxial dielectric layer and the second conductor layer on the epitaxial dielectric layer, and then the second conductor layer is formed.

5. A manufacturing method of an electronic circuit device including a multi-layer circuit board according to claim 1, wherein the multi-layer circuit substrate has a layer thereon for leveling the surface thereof.

6. A manufacturing method of an electronic circuit device including a multi-layer circuit board according to claim 5, wherein the layer for leveling the surface of the multi-layer circuit substrate is an organic polymeric resin layer.

7. A manufacturing method of an electronic circuit device including a multi-layer circuit board according to claim 1, wherein the first electrode layer is comprised of at least one member selected from the group consisting of Ru, Pt and Pd.

8. A manufacturing method of an electronic circuit device including a multi-layer circuit board according to claim 1, wherein the epitaxial dielectric layer is a perovskite type oxide thin epitaxial dielectric film.

* * * * *